United States Patent [19]

Kadomura

[11] Patent Number: 5,312,518

[45] Date of Patent: May 17, 1994

[54] DRY ETCHING METHOD

[75] Inventor: Shingo Kadomura, Kanagawa, Japan

[73] Assignee: Sony Corporation, Tokyo, Japan

[21] Appl. No.: 891,448

[22] Filed: May 29, 1992

[30] Foreign Application Priority Data

May 31, 1991 [JP] Japan .................................. 3-155454

[51] Int. Cl.$^5$ ............................................. H01L 21/00
[52] U.S. Cl. ..................... 156/662; 156/643;
156/646; 156/657; 156/653
[58] Field of Search ............... 156/643, 646, 662, 652,
156/653, 657, 655

[56] References Cited

U.S. PATENT DOCUMENTS

| 4,313,782 | 2/1982 | Sokoloski | 156/662 |
| 4,431,477 | 2/1984 | Zajac | 156/643 |
| 4,711,698 | 12/1987 | Douglas | 156/653 |
| 4,720,323 | 1/1988 | Sato | 156/646 |
| 4,832,787 | 5/1989 | Bondur et al. | 156/643 |
| 4,836,885 | 6/1989 | Breiten et al. | 156/643 |
| 4,943,344 | 3/1990 | Tachi et al. | 156/643 |
| 4,956,043 | 9/1990 | Kanetomo et al. | 156/345 |
| 4,992,136 | 2/1991 | Tachi et al. | 156/643 |

FOREIGN PATENT DOCUMENTS

| 0265584 | 5/1988 | European Pat. Off. . |
| 0410635A1 | 1/1991 | European Pat. Off. . |
| 63-141316 | 6/1988 | Japan . |
| 63-174322 | 7/1988 | Japan . |
| 3060032 | 3/1991 | Japan . |
| 3231426 | 10/1991 | Japan . |

OTHER PUBLICATIONS

"D. C. Plasma Etching of Silicon By Sulfur Hexalfluoride: Mass Spectrometric Study of the Discharge Products"; Wagner et al.; 1981; Plasma Chem. Plasma Process; 1(2); Abstract only.

Plumb et al., "Gas-Phase Reactions of $SF_5$, $SF_2$, and SOF with $O(^3P)$: Their Significance in Plasma Processing", *Plasma Chemistry and Plasma Processing*, vol. 6, No. 3, 1986, pp. 247-258.

Kushner, "A kinetic study of the plasma-etching process. I. A model for the etching of Si and $SiO_2$ in $C_nF_m/H_2$ and $C_nF_m/O_2$ plasmas", *Journal of Applied Physics*, vol. 53, No. 4, Apr. 1982, pp. 2923-2938.

Fior et al., "High-Selectivity, Silicon Dioxide Dry Etching Process", *Solid State Technology*, vol. 31, No. 4, Apr. 1988, pp. 109-112.

Bondur et al., "Selective Reactive Ion Etching of Silicon Compounds", *IBM Technical Disclosure Bulletin*, vol. 21, No. 10, Mar. 1979, p. 4015.

Patent Abstracts of Japan, vol. 16, No. 307 (E-1229) Jul. 7, 1992 for Japanese Published Application No. 4084427 of Jul. 7, 1992.

Takuo Sugano, "Semiconductor Plasma Process Technology", pp. 133-134, published by Sangyo Tohio Company, Ltd.

1980 National Convention Record, *IEE Japan*, vol. 5, paper S6-2.

Primary Examiner—Brian Hearn
Assistant Examiner—George Goudreau
Attorney, Agent, or Firm—Hill, Steadman & Simpson

[57] ABSTRACT

A dry etching method whereby an $SiO_2$ layer and an $Si_3N_4$ layer may be etched with high selectivity for each other. As etching gas, such sulfur fluorides as $S_2F_2$ are used which, when dissociated by electric discharges, will form $SF_x^+$ as a main etchant for the $SiO_2$ layer or $F^*$ as a main etchant for the $Si_3N_4$ layer and release sulfur in the plasma. When the $SiO_2$ layer is etched on the $Si_3N_4$ layer as an underlying layer via a resist mask, nitrogen atoms, removed from the underlying layer upon exposure thereof to the plasma, will combine with sulfur in the plasma to form on the exposed surface thereof such sulfur nitride compounds as polythiazyl $(SN)_x$, which will, in turn, serve to achieve high selectivity for the underlying layer. The $SiO_2$ layer can also be etched via an $Si_3N_4$ mask patterned into a predetermined shape, in which case sulfur nitride compounds formed on the $Si_3N_4$ mask will serve to achieve high selectivity therefor.

9 Claims, 3 Drawing Sheets

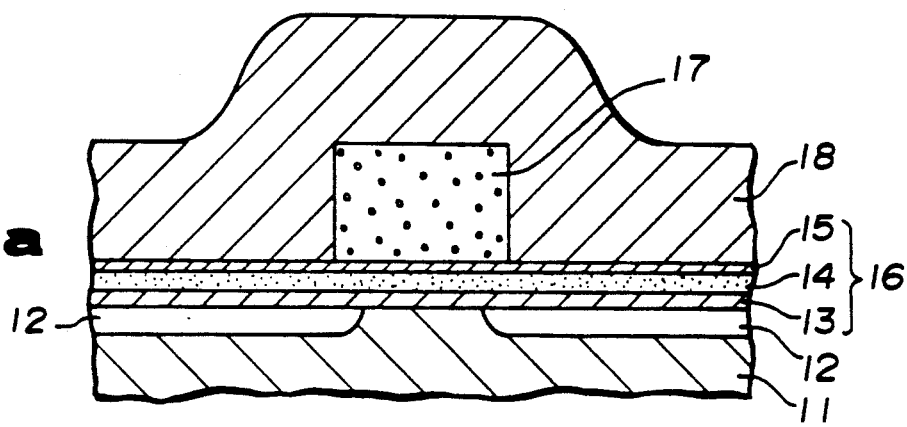
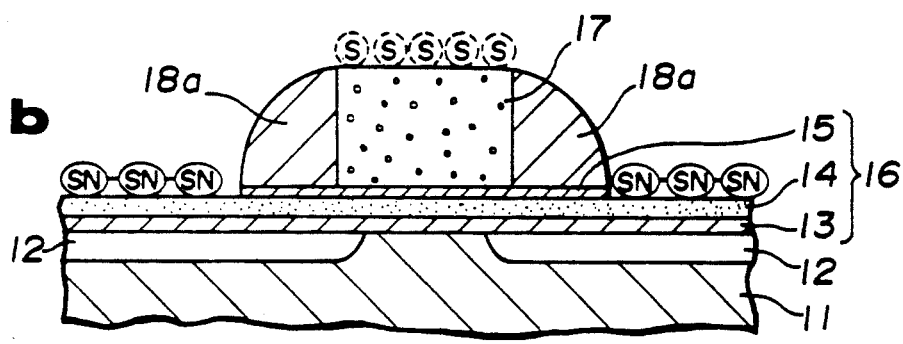
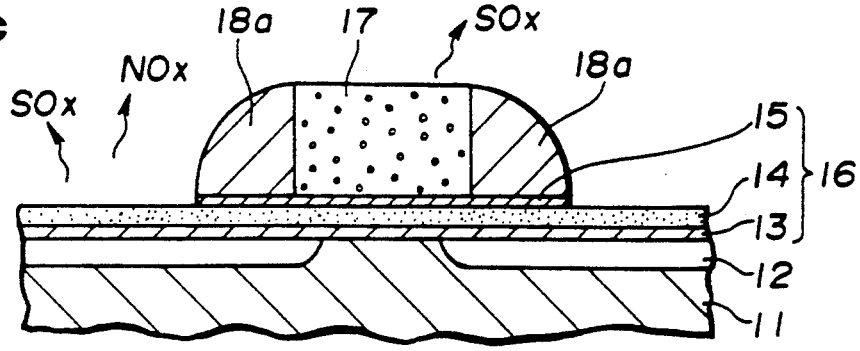

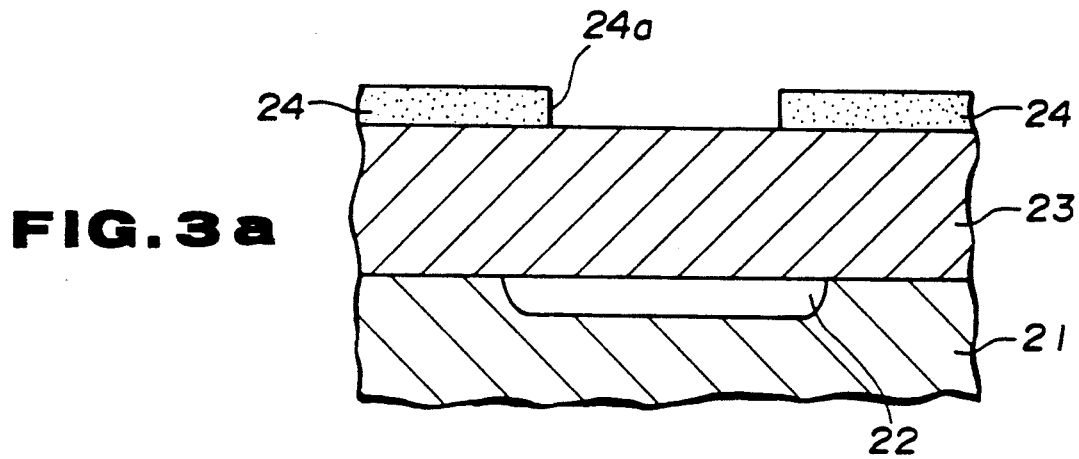
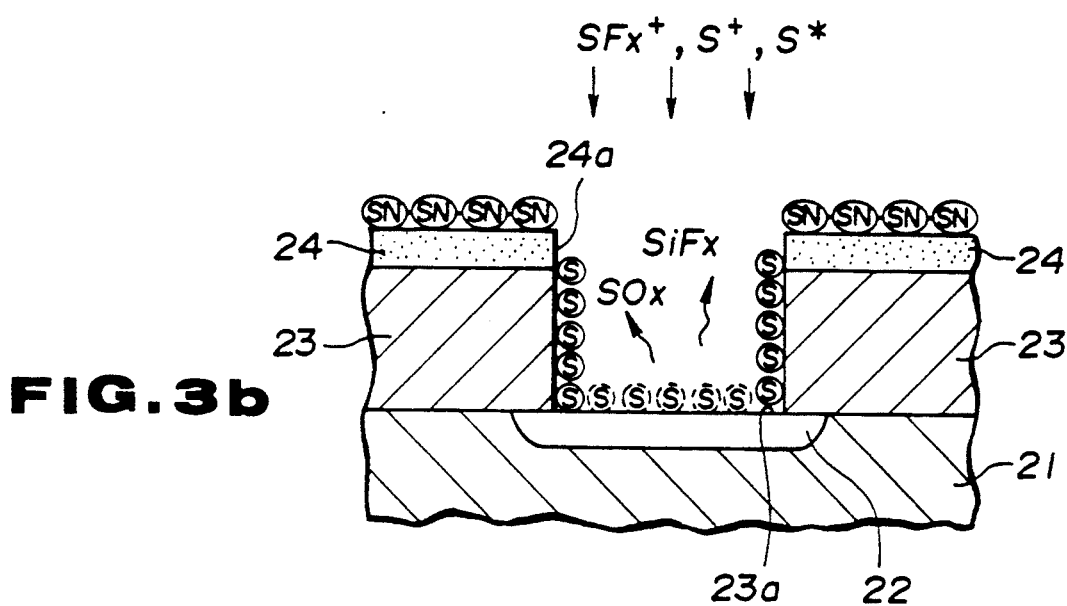
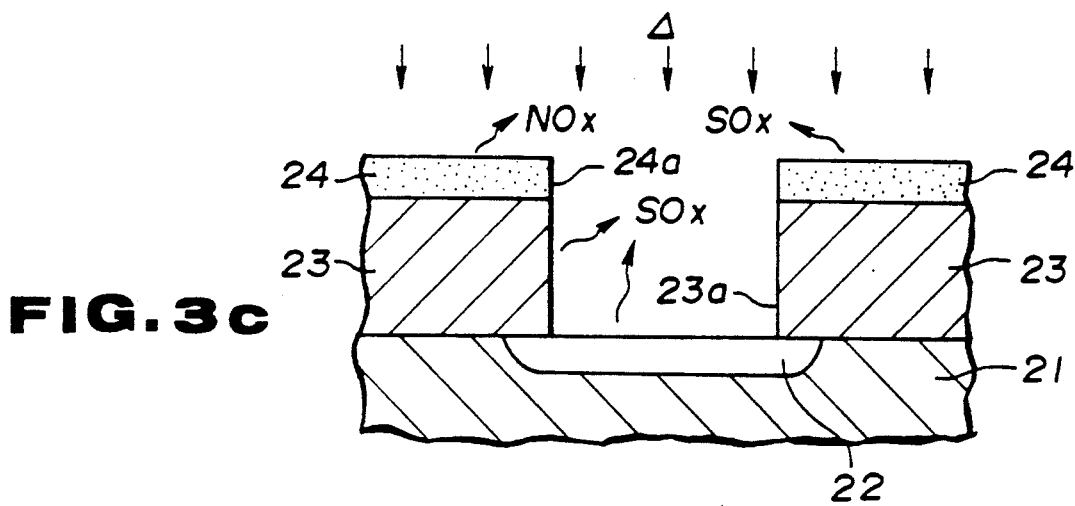

DRY ETCHING METHOD

BACKGROUND OF THE INVENTION

1. Field of the Invention

The present invention relates to a dry etching method employed in such applications as production of semiconductor devices. More particularly, it relates to a dry etching method whereby a silicon oxide based material layer and a silicon nitride based material layer may be etched with high selectivity for each other.

2. Description of the Prior Art

The recent trend toward higher integration and performance of such semiconductor devices as VLSIs and ULSIs requires dry etching technologies for insulation films to achieve correspondingly higher anisotropy, higher etchrate, higher selectivity, lower pollution, and less damage with no compromise in these requirements.

Conventionally, etching gases typified by $CHF_3$ gas, $CF_4/H_2$ mixed gas, $CF_4/O_2$ mixed gas, and $C_2F_6/CHF_3$ mixed gas have been widely used to etch an insulation film composed of silicon oxide ($SiO_x$; particularly, $x=2$). All these etching gases are composed mainly of fluorocarbon based gas whose molecule has C/F ratio (the ratio of the numbers of carbon atoms to that of fluorine atoms in one molecule) of 0.25 or higher. The common functions of these gases include: (a) forming a C—O bond from a constituent element C on the surface of a $SiO_2$ layer and cleaving or weakening an Si—O bond, (b) forming $CF_n^+$ (particularly, $n=3$) as a main etchant for an $SiO_2$ layer, and (c) generating relatively carbon-rich plasma and thereby removing oxygen from $SiO_2$ in the form of CO or $CO_2$ while achieving a lower etchrate and higher selectivity for an underlying silicon layer as C, H, F, and other constituent elements contribute to deposition of carbonaceous polymers on the surface of the underlying layer.

It is to be noted that the above mentioned $H_2$ and $O_2$ are used to regulate selectivity for an underlying silicon layer, in other words, the apparent C/F ratio of an etching reaction system by increasing or decreasing the quantity of $F^*$.

Basically, etching gases for an $SiO_2$ layer are also used to etch an insulation layer composed of silicon nitride ($Si_xN_y$, particularly, $x=3$ and $y=4$). While the $SiO_2$ layer is etched mainly through an ion-assisted reaction, the $Si_xN_y$ layer is etched at a higher rate through a radical reaction using $F^*$ as a main etchant. Such an etchrate difference is somewhat predictable from the descending order in binding energy of an Si—F bond (132 kcal/mole), Si—O bond (111 kcal/mole), and Si—N bond (105 kcal/mole). Incidentally, these binding energy values are cited from data shown in "Handbook of Chemistry and Physics" 69th Edition (1988) edited by R. C. Weast (published by CRC Press Inc. in Florida, U.S.A.) and may vary slightly according to any other calculation method.

Meanwhile, the recent trend toward higher integration of semiconductor devices requires correspondingly higher selectivity for an $SiO_x$ layer and an $Si_xN_y$ layer.

For instance, an $Si_xN_y$ layer formed on an $SiO_x$ layer as an underlying layer is etched in the LOCOS method where the $Si_xN_y$ layer is patterned to define an element isolation region. This etching process requires extremely high selectivity for the underlying layer now that a pad oxide film ($SiO_2$ layer) is decreased in thickness to minimize bird's beak length.

On the other hand, an $SiO_x$ layer formed on an $SiN_x$ layer as an underlying layer must be etched, for instance, in a contact hole forming process. In recent years, a thin $Si_xN_y$ layer may be formed between the $SiO_x$ interlayer insulating film and the Si substrate for the purpose of reducing damage to the substrate in an over-etching process. To achieve this purpose, this etching process also requires extremely high selectivity for the underlying $SiN_x$ layer.

In principle, when achieving high selectivity for two laminated dissimilar material layers, it is preferable that there should be a great difference in interatomic bond energy between the chemical bonds of the layers. In the case of an $SiO_x$ layer and an $Si_xN_y$ layer, in particular, it is essentially difficult to achieve high selectivity between these two layers because of little difference in bond energy between the bonds thereof (Si—O bond and Si—N bond, respectively) and common bases of the etching gas thereof. Therefore, persistent efforts have been made in industrial sectors to develop technologies for overcoming such difficulty.

In fact, some technologies have been reported for etching an $Si_xN_y$ layer formed on an $SiO_x$ layer with high selectivity between these two layers.

For instance, the present inventor has disclosed in Japanese Patent "KOKAI" 61-142744 (1986) one such technology whereby $CH_2F_2$ or any other gas with a low C/F ratio are used as etching gas with $CO_2$ added at a molar ratio of 30 to 70%. More specifically, such gases with a low C/F ratio will form $CF_x^+$ (particularly, $x=3$) as an etchant for an $SiO_x$ layer only by recombining with $F^*$. The quantity of $CF_x^+$ thus formed will decrease when a great quantity of $CO^*$ is fed to capture $F^*$ for removal from an etching reaction system in the form of COF. As a result, an etchrate for the $SiO_x$ layer will also decrease. Meanwhile, an $Si_xN_y$ layer is etched by other ions than $CF_x^+$ and radicals, so that the etchrate thereof will remain almost unchanged even when a great quantity of $CO_2$ is fed to the etching reaction system. Thus, high selectivity will be achieved between the $SiO_x$ layer and the $Si_xN_y$ layer.

"Proceedings of Symposium on Dry Process", Vol. 88, No. 7, p. 86-94 (1987) has also reported another technology whereby an $Si_xN_y$ layer formed on an $SiO_x$ layer is etched by FCl which will be formed in the gaseous phase by microwave discharge when $NF_3$ and $Cl_2$ are fed to a chemical dry etching apparatus. This technology is based on the fact that an Si—N bond with a 30% ionicity has a stronger covalency than an Si—O bond with a 55% ionicity. Namely, the $Si_xN_y$ layer, whose chemical bond (Si—N bond) is similar in nature to the chemical bond (covalent bond) of single-crystal silicon, will be etched by $F^*$, $Cl^*$, and other radicals resulting from dissociation of FCl while the $SiO_x$ layer will almost never be etched by these radicals. Thus, high selectivity will also be achieved between the two layers.

As mentioned above, some technologies have been reported for selectively etching an $Si_xN_y$ layer formed on an $SiO_x$ layer. This is a natural consequence considering the difference in etchrate between the two layers. When the $Si_xN_y$ layer is etched mainly through a radical reaction, exposure of the $SiO_x$ layer to a plasma in the etching process will inevitably result in reduction of the etchrate.

However, there are some difficulties with the conventional technologies. For instance, anisotropic etching is essentially difficult with the above-mentioned technology using FCl because it is based on a radical reaction.

Conversely, no technology has been reported for selectively etching an $SiO_x$ layer formed on an $Si_xN_y$ layer. This etching process etches the $SiO_x$ layer mainly through an ion-assisted reaction and involves even greater difficulty in achieving high selectivity between the two layers because radicals formed invariably in the etching reaction system will increase the etchrate upon exposure of the $Si_xN_y$ layer to the plasma. In fact, it is certain that this etching process will be needed in the future and it is required to realize it as soon as possible.

OBJECT AND SUMMARY OF THE INVENTION

It is therefore an object of the present invention to provide a dry etching method whereby an $SiO_x$ layer and an $Si_xN_y$ layer may be etched with high selectivity for each other.

According to one aspect of the present invention, it provides a process of etching an $SiO_x$ layer formed on an $Si_xN_y$ layer with high selectivity between these two layers.

This process uses four sulfur fluorides $S_2F_2$, $SF_2$, $SF_4$, and $S_2F_{10}$, which have been proposed by the present inventor as effective chlorofluorocarbon-free (CFC-free) etching gas for an $SiO_x$ layer. These sulfur fluorides will be dissociated by electric discharges to form $SF_x^+$ in the plasma, which will, in turn, act as a main etchant for an $SiO_x$ layer. Si will be removed from the $SiO_x$ layer in the form of $SiF_x$.

The four sulfur fluorides have an important advantage over the conventionally well-known sulfur fluoride $SF_6$ in that they have a high S/F ratio (the ratio of the numbers of sulfur atoms to that of fluorine atoms in one molecule) and form free sulfur in the plasma. The sulfur thus formed will adsorb on the surface of a target substrate (wafer) maintained at a lower temperature than room temperature. Likewise, sulfur will adsorb on the surface of a target layer ($SiO_2$ layer) and form $SO_x$ ($x=2$ or 3) with the assistance of high-energy incident ions striking on that surface for removal from the etching reaction system. Meanwhile, sulfur will be deposited on, and competitively removed through sputtering from, the surface of a resist mask and an underlying silicon layer, thus improving selectivity for both the resist mask and the underlying layer. Further, the sulfur will serve to protect pattern sidewalls, on which no incident ion will strike in principle.

The sulfur deposits will sublime immediately upon heating of the substrate after etching and therefore avoid the danger of particle pollution.

When the $SiO_x$ layer has almost been etched, the underlying $Si_xN_y$ layer will be exposed to the plasma while $F^*$ present in the plasma will extract silicon atoms from the surface of the $Si_xN_y$ layer to form dangling nitrogen bonds. The dangling nitrogen bonds present on the surface of the $Si_xN_y$ layer has already been discussed in "Semiconductor Plasma Process Technology" by Takuo Sugano, P. 133–134 (published by Sangyo Tosho Co., Ltd.), and 1980 National Convention Record, IEE Japan, Vol. 5, S 6-2. According to the present invention, the dangling nitrogen bonds will combine with the sulfur formed in the plasma to form various sulfur nitride based compounds, which, in turn, will serve to protect the surface of the $Si_xN_y$ layer and achieve high selectivity for this layer.

The most typical of the above-mentioned sulfur nitride based compounds is polythiazyl represented by a general formula $(SN)_x$. The simplest process of forming polythiazyl is that the sulfur formed in the plasma combines with the dangling nitrogen bonds to form thiazyl ($N\equiv S$), which has unpaired electrons analogous to those of an oxygen analog nitrogen oxide (NO) and polymerizes easily to form $(SN)_2$, $(SN)_4$, and $(SN)_x$. $(SN)_2$ polymerizes easily at temperatures around 20° C. to form $(SN)_4$ and $(SN)_x$, and decomposes at temperatures around 30° C. $(SN)_4$ is a ring compound with a melting point of 178° C. and a decomposition point of 206° C.

The property and structure of $(SN)_x$ are described in detail in J. Am. Chem. Soc., Vol. 29, p. 6358–6363 (1975). $(SN)_x$ is a polymerized compound that will remain stable up to temperatures around 208° C. under atmospheric pressure and 140° to 150° C. under reduced pressure. In a crystalline state, it is so structured that principal chains each composed of repetitive covalent bonds S—N—S—N—--- are oriented in parallel to one another. Consequently, when deposited on a layer, sulfur nitride based compounds, typically $(SN)_x$, will effectively inhibit $F^*$ and other radicals from invading the layer. Even when accelerated incident ions strike the layer, they will absorb or alleviate the impact of the ions on the layer by producing so-called sponge effects derived from changes in their bond angle, conformation, and other property.

Besides sulfur, $F^*$ deriving from sulfur fluoride is also present in the plasma, so that the resulting fluorine may combine with the $(SN)_x$ to form thiazyl fluoride. Further, when nitrogen based gas is added to regulate the quantity of $F^*$ formed in the plasma, the resulting hydrogen may combine with the $(SN)_x$ to form hydrogen thiazyl.

Under some conditions, the above-mentioned sulfur nitride based compounds may be $S_4N_2$ (melting point: 23° C.), $S_{11}N_2$ (melting point: 150°–155° C.), $S_{15}N_2$ (melting point: 137° C.), $S_{16}N_2$ (melting point: 122° C.), and other cyclic sulfur nitride compounds containing much more sulfur atoms than nitrogen atoms, as well as $S_7NH$ (melting point: 113.5° C.), 1, 3—$S_6$ (NH)$_2$ (melting point: 130° C.), 1, 4—$S_6$ (NH)$_2$ (melting point: 133° C.), 1, 5—$S_6$ (NH)$_2$ (melting point: 155° C.), 1, 3, 5—$S_5$ (NH)$_3$ (melting point: 124° C.), 1, 3, 6—$S_5$ (NH)$_3$ (melting point: 131° C.), $S_4$ (NH)$_4$ (melting point: 145° C.), and other imide compounds composed of hydrogen atoms combined with nitrogen atoms of the abovementioned cyclic sulfur nitride compounds.

All these sulfur nitride based compounds with sulfur and nitrogen as the constituent elements thereof will be removed in the form of $N_2$, $NO_x$, $SO_x$, etc. upon removal of the resist mask through $O_2$ plasma aching without remaining on the wafer or causing particle pollution.

According to another aspect of the present invention, it provides a process of etching an $SiO_x$ layer masked with an $Si_xN_y$ layer while achieving high selectivity for the $Si_xN_y$ mask.

This process achieves high selectivity on the same principle as mentioned above. In this process, the top surface of the $Si_xN_y$ mask is exposed to the plasma at the start of etching, whereupon $F^*$ present in the plasma will remove silicon atoms from the surface of the $Si_xN_y$ mask to form dangling nitrogen bonds and sulfur will combine with the dangling nitrogen bonds to form various sulfur nitride based compounds, typically $(SN)_x$, which will, in turn, cover the surface of the $Si_xN_y$ mask. Meanwhile, the $SiO_x$ layer will be etched at a high rate while free sulfur in the plasma will serve to protect the pattern sidewalls.

Conventionally, the $SiO_x$ layer used to be etched by high-energy incident ions and often cause dimension losses due to recession of the $Si_xN_y$ mask. This problem can be solved by the present invention.

In this process, the $Si_xN_y$ layer formed on the target $SiO_x$ layer and covered with a resist mask must be etched to form the $Si_xN_y$ mask. Such preliminary etching can be performed with high selectivity in the above-mentioned process. According to the present invention, once the $Si_xN_y$ mask is formed, the resist mask is removed from the $Si_xN_y$ layer and the $SiO_x$ layer is etched with the surface thereof covered only with the $Si_xN_y$ mask. As a result, there is no danger of carbonaceous decomposition products being formed in the etching reaction system due to decomposition of the resist material and hence the advantage of reducing particle pollution.

As is clear from the foregoing description, the present invention provides a dry etching method whereby an $SiO_x$ layer and $Si_xN_y$ layer may be etched with high selectivity for each other. More particularly, the present invention realizes an unprecedented process of selectively etching an $SiO_x$ layer formed on an $Si_xN_y$ layer, thus opening up the possibility of developing novel semiconductor device structures to say nothing of providing an effective CFC-free etching method.

Accordingly, the present invention is particularly useful for such industrial applications as production of large-scale integrated high-performance semiconductor devices conforming to strict design rules.

BRIEF DESCRIPTION OF THE DRAWINGS

FIG. 1a shows a stage at which a resist mask was formed on an $SiO_2$ inter-layer insulation film. FIG. 1b shows a stage at which the $SiO_2$ inter-layer insulation film was etched. FIG. 1c shows a stage at which a resist mask and sulfur and $(SN)_x$ deposits were removed through plasma aching. FIG. 1d shows a stage at which an $Si_3N_4$ base film was selectively removed from a contact hole.

FIGS. 2a–2c are schematic cross-sectional views showing the stages of a dry etching method applied in another preferred embodiment to an etch-back process in which a sidewall is formed on both sides of a gate electrode formed on a gate insulation film having a so-called ONO structure. FIG. 2a shows the stage at which an $SIO_2$ layer was formed all over a wafer. FIG. 2b shows the stage at which the $SiO_2$ layer or a second $SiO_2$ insulation film was etched back or selectively etched, respectively. FIG. 2c shows the stage at which sulfur and $(SN)_x$ deposits were decomposed or sublimed for removal through heating.

FIGS. 3a–3c are schematic cross-sectional views showing the stages of a dry etching method applied in still another embodiment to a contact hole forming process. FIG. 3a shows the stage at which an $Si_3N_4$ mask was formed on an $SiO_2$ inter-layer insulation film before it was etched. FIG. 3b shows the stage at which the $SiO_2$ inter-layer insulation film was etched. FIG. 3c shows the stage at which sulfur and $(SN)_x$ deposits were decomposed or sublimed for removal through heating.

DETAILED DESCRIPTION OF THE INVENTION

The following paragraphs describe some preferred embodiments of the present invention.

EXAMPLE 1

In the first example, a dry etching method according to one aspect of the present invention is applied to a contact hole forming process in which an $SiO_2$ inter-layer insulation film is etched by $S_2F_2/H_2$ mixed gas. This process is described by referring to FIGS. 1a–1d. It is to be noted that FIGS. 1a–1d are drawn with a smaller aspect ratio than usual in order to provide schematic representations.

Figure 1A:
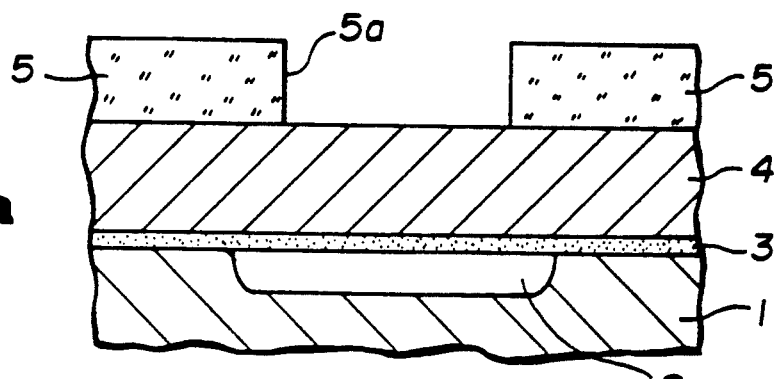
FIGS. 1a–1d are schematic cross-sectional views showing the stages of a dry etching method applied in one preferred embodiment to a contact hole forming process.

Referring first to FIG. 1a, a silicon substrate (wafer) 1 carrying an impurity-diffused region 2 was provided on the surface thereof with an $Si_3N_4$ base film 3 which was formed in the thickness of 10 nm, for instance, by low pressure chemical vapor deposition (LPCVD). Then, the $Si_3N_4$ base film 3 was provided on the surface thereof with a $SiO_2$ inter-layer insulation film 4 which was formed in the thickness of 500 nm by normal pressure CVD. Further, the $SiO_2$ inter-layer insulation film 4 was coated on the surface thereof with chemical amplification negative type three-component photoresist SAL-601 (brand name of Shipley Co., Inc.) and a resist mask 5 was so formed as to have an opening 5a by excimer laser lithography and alkaline development.

The target wafer thus formed was set on a wafer supporting electrode provided on a magnetron reactive ion etching (RIE) apparatus and cooled to about $-50°$ C. by an ethanol refrigerant which was fed from a cooling system, for instance, a chiller for circulation through a cooling pipe housed in the wafer supporting electrode. In this state, the $SiO_2$ inter-layer insulation film 4 was etched, for instance, with an $S_2F_2$ flow rate of 50 SCCM, $H_2$ flow rate of 20 SCCM, gas pressure of 1.3 Pa (10 mTorr), and RF power of 1000 W (2 MHz).

Figure 1B:
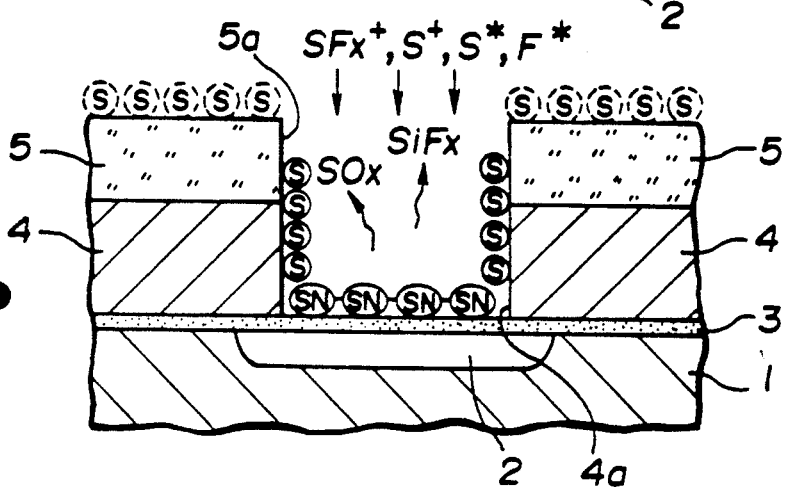

Referring next to FIG. 1b, there is schematically shown a mechanism of the above etching. In the drawing, the composition formulas encircled in a dotted line represent those chemical species which are deposited on, and simultaneously removed through sputtering from, the surface of the wafer while encircled in a continuous line are those chemical species which remain deposited on the surface of the wafer.

The $SiO_2$ inter-layer insulation film 4 was etched by $S^*$, $F^*$, and other radicals formed in the plasma as the reaction of these radicals was assisted by $SF_x^+$, $S^+$, and other ions. Also present in the plasma was free sulfur, which resulted from dissociation of $S_2F_2$ by electric discharges and adsorbed on the surface of the wafer as it was cooled to lower temperature than room temperature. Likewise, sulfur adsorbed on the surface of the $SiO_2$ inter-layer insulation film 4 and combined with oxygen fed from that surface through sputtering to form $SO_x$ for removal from the etching reaction system. Thus, the sulfur present on the surface of the $SiO_2$ inter-layer insulation film 4 never reduced the etchrate thereof. By contrast, sulfur was deposited on, and simultaneously removed through sputtering from, the surface of the resist mask 5, thus reducing the etchrate thereof and improving selectivity for the resist mask 5. Meanwhile, sulfur deposited on pattern sidewalls, on which no incident ion struck in principle, and served to protect it, forming a contact hole 4a having a vertical wall.

It is to be noted that $H_2$ is used as an additive gas to increase the apparent S/F ratio of the etching reaction system and prevent $F^*$ from deteriorating selectivity for the base layer. More specifically, $H_2$ will be dissociated to form $H^*$, which is capable of capturing part of $F^*$ for removal from the etching reaction system in the form of HF. Such S/F ratio regulation is extremely useful in preventing deterioration of anisotropy or selectivity for the underlying layer in an over-etching process where $F^*$ will become excessive.

Referring further to FIG. 1b, when the $SiO_2$ inter-layer insulation film 4 was almost etched, the $Si_3N_4$ base film 3 was exposed at the bottom of the contact hole 4a, whereupon nitrogen supplied from the $Si_3N_4$ base film 3 combined with sulfur present in the plasma to form a sulfur nitride based compound, that is, a polymerized thiazyl compound $(SN)_x$ in the drawing. $(SN)_x$ thus formed deposited on the $Si_3N_4$ base film 3, reducing the etchrate thereof and achieving selectivity ratio of about 15 for the $Si_3N_4$ base film 3.

Figure 1C:
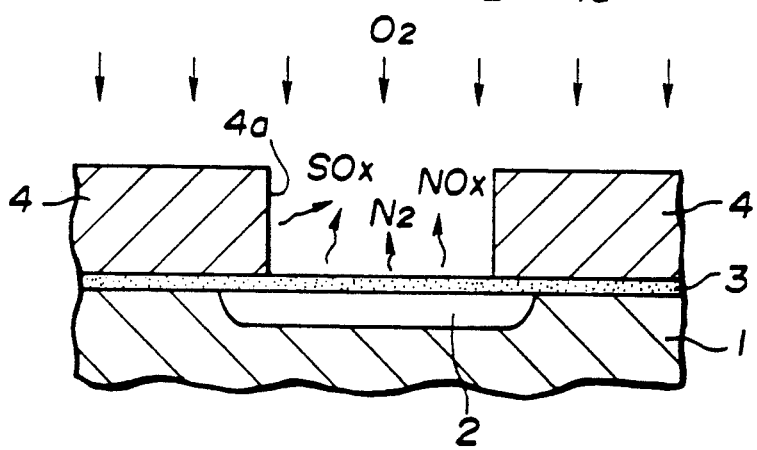

Referring next to FIG. 1c, when the wafer was set on a plasma asher to remove the resist mask 5 in $O_2$ plasma, the sulfur deposited on the pattern sidewalls was burned for removal in the form of $SO_x$ while the $(SN)_x$ deposited on the surface of the $SiO_2$ inter-layer insulation film 4 were also burned or decomposed for removal in the form of $N_2$, $NO_x$, $SO_x$, etc.

Figure 1D:
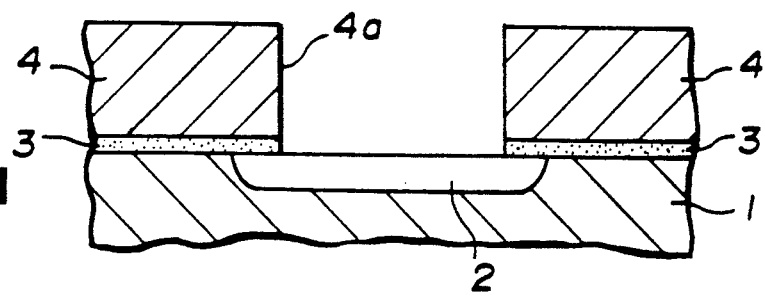

Referring finally to FIG. 1d, when the wafer was immersed in hot aqueous phosphate solution, the $Si_3N_4$ base film 3 exposed at the bottom of the contact hole 4a was decomposed for removal.

In the above example, the contact hole 4a was formed in an excellent anisotropic shape without causing damage to the impurity-diffused region 2 or particle pollution.

EXAMPLE 2

In the second example, a dry etching method according to one aspect of the present invention is applied to a contact hole forming process in which an $SiO_2$ inter-layer insulation film is etched by $S_2F_2/H_2S$ mixed gas.

In the second example, the same wafer as in the first example is used as an etching sample.

The wafer was set on a wafer supporting electrode provided on an RF biased magnetically enhanced microwave plasma etching apparatus. In this state, the $SiO_2$ inter-layer insulation film 4 was etched, for instance, with an $S_2F_2$ flow rate of 50 SCCM, $H_2$ flow rate of 15 SCCM, gas pressure of 1.3 Pa (10 mTorr), microwave power of 850 W, RF bias power of 200 W (400 kHz), and wafer temperature of 50° C.

In the second example, etching proceeded by the same mechanism as in the first example, except that $H_2S$ was used as additive gas to supply sulfur, thereby promoting sulfur deposition.

In the second example, too, the contact hole 4a was formed in an excellent anisotropic shape while achieving high selectivity for the $Si_3N_4$ base film 3.

EXAMPLE 3

In the third example, a dry etching method according to one aspect of the present invention is applied to an etch-back process in which a sidewall composed of an $SiO_2$ layer is formed on both sides of a gate electrode formed on a gate insulation film containing an $Si_3N_4$ film. This process is classified among manufacturing processes for MOS-FET having an LDD structure. This process is described by referring to FIGS. 2a–2c.

Referring first to FIG. 2a, a silicon substrate 11 was provided on the surface thereof with a gate insulation film 16 having a so-called ONO (oxide film/nitride film/oxide film) structure. Then, the gate insulation film 16 was provided on the surface thereof with a gate electrode 17 which was formed through patterning from an n+ type polysilicon layer. Masked with the gate electrode 17, the silicon substrate 11 was implanted with ions to form low-density-impurity-diffused regions 12 on the surface thereof. Further, an $SiO_2$ layer 18 was deposited all over the wafer by CVD. The gate insulation film 16 was composed of a first $SiO_2$ gate insulation film 13 (4 nm thick), $Si_3N_4$ gate insulation film 14 (6 nm thick), and second $SiO_2$ gate insulation film 15 (2 nm thick) which were laminated in this order on the silicon substrate 11.

The wafer was set on a wafer supporting electrode provided on an RF biased magnetically enhanced microwave plasma etching apparatus. In this state, the $SiO_2$ layer 18 was etched back and the second $SiO_2$ gate insulation film 15 was etched, for instance, with an $S_2F_2$ flow rate of 50 SCCM, gas pressure of 1.3 Pa (10 mTorr), RF power of 200 W (400 kHz), and wafer temperature of −80° C.

In the third example, etching proceeded by the same mechanism as in the first example, except that neither $H_2$ nor $H_2S$ was used as additive gas to consume $F^*$ and that the wafer was cooled to even a lower temperature, thereby inhibiting reaction by $F^*$ and promoting sulfur deposition.

Referring next to FIG. 2b, when etching was completed, the gate electrode 17 and the $Si_3N_4$ gate insulation film 14 were exposed to the plasma, whereupon sidewalls 18a were formed on both sides of the gate electrode 17. Unlike the $SiO_2$ layer 18, the gate electrode 17 ceased to be supplied with oxygen and had sulfur depositing on the surface thereof, thus greatly reducing the etchrate and achieving high selectivity therefor. Meanwhile, the $Si_3N_4$ gate insulation film 14 also had sulfur nitride based compounds, typically $(SN)_x$, depositing on the surface thereof, thus greatly reducing the etchrate and achieving a selectivity ratio of about 20 therefor.

Referring finally to FIG. 2c, when the wafer was heated to about 130° C. or higher after completion of the etching, the sulfur and sulfur nitride based compound were removed from the surface of the wafer immediately. Namely, the sulfur was sublimed upon heating of the wafer to temperatures around 90° C. and the sulfur nitride based compound was then decomposed for removal upon further heating of the wafer. In the third example, the sidewalls 18a were formed without causing damage to the underlying low-density-impurity-diffused regions 12.

EXAMPLE 4

In the fourth example, a dry etching method according to another aspect of the present invention is applied to a contact hole forming process in which an $SiO_2$ inter-layer insulation film was etched by $S_2F_2/H_2$ mixed gas via an $Si_3N_4$ mask. This process is described by referring to FIGS. 3a–3c.

Referring first to FIG. 3a, a silicon substrate (wafer) 21 carrying an impurity-diffused region 22 was provided on the surface thereof with an $SiO_2$ inter-layer insulation film 23 which was formed to a thickness of 1 μm, for instance, by normal pressure CVD. Further, the $SiO_2$ inter-layer insulation film 23 was provided on the surface thereof with $Si_3N_4$ masks 24 patterned into a predetermined shape. The $Si_3N_4$ masks 24 were so formed as to have an opening 24a by etching an $Si_3N_4$ layer (100 nm thick) formed, for instance, by low pressure CVD via a chemical amplification photoresist mask formed by excimer laser lithography and alkaline development. The photoresist mask had been removed from the $Si_3N_4$ layer through ashing.

The target wafer thus formed was set on a wafer supporting electrode provided on an RF biased magnetically enhanced microwave plasma etching apparatus. In this state, the $SiO_2$ inter-layer insulation film 23 was etched, for instance, with an $S_2F_2$ flow rate of 50 SCCM, $H_2$ flow rate of 20 SCCM, gas pressure of 1.3 Pa (10 mTorr), microwave power of 850 W, and RF bias power of 200 W (400 kHz).

Referring next to FIG. 3b, when etching was started, the $Si_3N_4$ masks 24, which has already been exposed to the plasma, were coated immediately on the surface thereof with sulfur nitride based compounds, typically $(SN)_x$, thus greatly reducing the etchrate and achieving an selectivity ratio of about 20 therefor. As a result, the $SiO_2$ inter-layer insulation film 23 was etched without causing dimension losses due to recession of the $Si_3N_4$ mask while a contact hole 23a was formed without deteriorating the sectional form thereof.

Meanwhile, the $SiO_2$ inter-layer insulation film 23 was etched into an anisotropic shape as sulfur was deposited on the sidewalls thereof and served to protect them. Upon exposure of the underlying impurity-diffused region 22 to the plasma, sulfur also was deposited on the surface thereof, thus greatly reducing the etchrate, and achieving high selectivity in an over-etching process therefor.

Referring finally to FIG. 3c, when etching was completed, the wafer was heated to about 130° C. or higher to remove the sulfur and sulfur nitride based compound.

Conventionally, an $SiO_2$ layer used to be etched by high energy incident ions, which, when sputtering on a resist mask, will cause recession thereof and resulting particle pollution. This problem can be solved by a dry etching method according to another aspect of the present invention, whereby the $SiO_2$ layer may be etched via an $Si_3N_4$ layer instead of the resist mask. The $Si_3N_4$ layer thus substituting for the resist mask may be left unremoved as part of an insulation film.

While the present invention has been described in four preferred examples thereof, it is to be understood that the present invention is not limited to those examples and that various changes and modifications may be made in the present invention without departing from the spirit and scope thereof. For instance, etching gas may contain any additive gas other than $H_2$ and $H_2S$, such as silane based gas for increasing the S/F ratio of gases in an etching reaction system and He, Ar, and other rare gases for producing sputtering, cooling, and dilution effects.

Further, etching will proceed by the same mechanism as in the preferred examples even when any sulfur fluoride proposed herein other than $S_2F_2$ is used as etching gas.

What is claimed is:

1. A dry etching method for etching a silicon oxide based material layer, comprising providing a silicon substrate, a three-layer gate insulation film being formed on said silicon substrate, a gate electrode formed on said gate insulation film, and an $SiO_2$ layer covering said gate electrode with said three-layer gate insulation film having a first $SiO_2$ gate insulation film, a $Si_3N_4$ gate insulation film, and a second $SiO_2$ gate insulation film; creating a plasma etching gas containing at least one compound selected from $S_2F_2$, $SF_2$, $SF_4$ and $S_2F_{10}$; etching part of said $SiO_2$ layer and part of said second $SiO_2$ gate insulation film to form a sidewall on both sides of said gate electrode.

2. A dry etching method for etching a $SiO_2$ layer formed on a substrate and masked with a $Si_3N_4$ material layer patterned into a predetermined shape by providing a plasma etching gas containing at least one compound selected from $S_2F_2$, $SF_2$, $SF_4$, and $S_2F_{10}$, and by etching portion of the $SiO_2$ layer exposed by said $Si_3N_4$ material layer.

3. A dry etching method as claimed in claim 2 wherein said substrate is composed of a silicon substrate, said $SiO_2$ layer is a $SiO_2$ insulation film formed on said silicon substrate, and the $SI_3N_4$ mask is patterned into a predetermined shape and formed on said $SiO_2$ insulation film, said $SiO_2$ insulation film being etched via said $Si_3N_4$ mask to form a connection hole in said $SiO_2$ insulation film.

4. A dry etching method as claimed in claim 2 wherein said etching gas contains at least one compound selected from $H_2$, $H_2S$, and silane compounds as an additive gas capable of consuming halogen radicals.

5. A dry etching method as claimed in claim 2 wherein said etching gas contains rare gas as an additive gas.

6. A dry etching method comprising providing a substrate having a $Si_3N_4$ layer and a $SiO_2$ layer on the $Si_3N_4$ layer, creating a plasma etching gas containing a fluorine gas selected from $S_2F_2$, $SF_2$, $SF_4$ and $S_2F_{10}$, maintaining the substrate at a temperature lower than room temperature, etching the $SiO_2$ layer while depositing a sulfur material on the $Si_3N_4$ layer, and subsequently heating the substrate to remove the sulfur material.

7. A dry etching method according to claim 6, wherein said substrate is composed of a silicon substrate, the $Si_3N_4$ layer is a film formed directly on said silicon substrate, said $SiO_2$ layer being an insulation film formed on said $Si_3N_4$ film, and a resist mask formed selectively on said $SiO_2$ insulation film, said step of etching causing the $SiO_2$ insulation film to be etched via said resist mask to form a connection hole in said $SiO_2$ layer insulation film to expose a portion of the $Si_3N_4$ film.

8. A dry etching method according to claim 6, wherein the plasma etching gas contains an additive gas to consume halogen radicals, said additive gas being at least one compound selected from $H_2$, $H_2S$ and silane compounds.

9. A dry etching method as claimed in claim 6 wherein said etching gas contains rare gas as additive gas.

* * * * *